US009780550B2

(12) United States Patent
Hopf et al.

(10) Patent No.: US 9,780,550 B2
(45) Date of Patent: Oct. 3, 2017

(54) PROTECTIVE DEVICE FOR A PHOTOVOLTAIC SYSTEM

(71) Applicant: SMA Solar Technology AG, Niestetal (DE)

(72) Inventors: Markus Hopf, Espenau (DE); Matthias Victor, Niestetal (DE); Frank Greizer, Kaufungen (DE); Gerd Bettenwort, Kassel (DE); Jens Friebe, Vellmar (DE)

(73) Assignee: SMA Solar Technology AG, Niestetal (DE)

( * ) Notice: Subject to any disclaimer, the term of this patent is extended or adjusted under 35 U.S.C. 154(b) by 1021 days.

(21) Appl. No.: 13/957,569

(22) Filed: Aug. 2, 2013

(65) Prior Publication Data

US 2013/0320778 A1    Dec. 5, 2013

Related U.S. Application Data

(63) Continuation of application No. PCT/EP2011/058049, filed on May 18, 2011.

(30) Foreign Application Priority Data

Feb. 2, 2011 (DE) .................. 10 2011 010 172
Feb. 15, 2011 (DE) .................. 10 2011 000 737

(51) Int. Cl.
*H01H 47/00* (2006.01)
*H02H 3/02* (2006.01)
*H01L 31/02* (2006.01)

(52) U.S. Cl.
CPC ......... *H02H 3/02* (2013.01); *H01L 31/02021* (2013.01); *Y02E 10/50* (2013.01);
(Continued)

(58) Field of Classification Search
CPC . H02H 3/02; H01L 31/02021; Y10T 307/766; Y10T 307/865; Y10T 307/858; Y02E 10/50
(Continued)

(56) References Cited

U.S. PATENT DOCUMENTS

2007/0177321 A1    8/2007  Weiberle et al.
2008/0224652 A1*   9/2008  Zhu .................. H02J 7/35
                                              320/101
(Continued)

FOREIGN PATENT DOCUMENTS

CN    101933209 A    12/2010
DE      4041672 A1    6/1992
(Continued)

OTHER PUBLICATIONS

International Preliminary Report on Patentability for PCT/EP2011/058049 dated Aug. 6, 2013.
(Continued)

*Primary Examiner* — Richard Tan
(74) *Attorney, Agent, or Firm* — Eschweiler & Potashnik, LLC (57) ABSTRACT

A protective device for a photovoltaic system includes at least one input for connection to a photovoltaic generator and at least one output for delivery of an electric power supplied from the photovoltaic generator. The protective device includes a detection device for a signal applied via the at least one output, and is configured to provide a low level-limited voltage at the at least one output if an applied signal does not meet a predetermined criteria, and is further configured to connect the at least one output with low resistance to the at least one input via a switching device if the applied signal meets the predetermined criteria.

23 Claims, 5 Drawing Sheets

(52) U.S. Cl.
    CPC ........ *Y10T 307/766* (2015.04); *Y10T 307/858* (2015.04); *Y10T 307/865* (2015.04)

(58) Field of Classification Search
    USPC .......................................... 307/116, 130, 131
    See application file for complete search history.

(56) References Cited

U.S. PATENT DOCUMENTS

| | | |
|---|---|---|
| 2009/0182532 A1 | 7/2009 | Stoeber et al. |
| 2010/0295381 A1* | 11/2010 | Burger ..................... G05F 1/67 307/126 |
| 2010/0300508 A1 | 12/2010 | Maier et al. |
| 2010/0326809 A1 | 12/2010 | Lang et al. |

FOREIGN PATENT DOCUMENTS

| | | |
|---|---|---|
| DE | 102008008505 A1 | 8/2009 |
| DE | 102010037760 A1 | 3/2011 |
| EP | 2077588 A2 | 7/2009 |
| JP | S62126418 A | 6/1987 |
| JP | H07168638 A | 7/1995 |
| JP | 2000105265 A | 4/2000 |
| JP | 2005327259 A | 11/2005 |
| JP | 2010063307 A | 3/2010 |
| WO | 2009006879 A2 | 1/2009 |
| WO | 2009073868 A1 | 6/2009 |
| WO | 2010078303 A2 | 7/2010 |
| WO | WO 2010/078303 * | 7/2010 |

OTHER PUBLICATIONS

International Search Report dated Nov. 16, 2011 for international Application No. PCT/EP2011/058049, 3 Pages.

* cited by examiner

PROTECTIVE DEVICE FOR A PHOTOVOLTAIC SYSTEM

REFERENCE TO RELATED APPLICATIONS

This application is a continuation of International application number PCT/EP2011/058049 filed on May 18, 2011, which claims priority to German application number 10 2011 010 172.1 filed on Feb. 2, 2011 & German application number 10 2011 000 737.7 filed on Feb. 15, 2011.

FIELD

The disclosure relates to a protective device for a photovoltaic system comprising at least one input for connection to a photovoltaic generator, and at least one output for delivery of electric power supplied by the photovoltaic generator. The disclosure further relates to a photovoltaic module with a protective device and an operating method for a protective device of a photovoltaic system.

BACKGROUND

Photovoltaic systems, abbreviated in the following as PV systems, are used to convert sunlight into electrical energy. Usually, a plurality of photovoltaic modules, abbreviated in the following as PV modules, each of which represents an interconnection of a plurality of solar cells, are electrically connected together as a photovoltaic generator. The photovoltaic generator (PV generator) is often connected to a remotely mounted inverter, which is used to convert the direct current (DC) supplied by the PV generator into alternating current that is suited for feeding into a public or private (isolated operation) power supply network.

Thereby the PV modules are most times connected in series in such a way that the DC power cables between the PV generator and the inverter are exposed to voltages in the range of distinctly more than 100 volts. A voltage of this magnitude is useful for efficiency reasons, to keep, among other things, ohmic loss in the lines tolerably small, without a need for selecting a large cable cross-section. When light strikes the PV modules there is, however, in case of damage, e.g., in case of a fire, or during installation and maintenance the risk of an electric shock that might be dangerous to life, due to high voltage. Without further protective measures, the danger to life in case of direct contact or indirect contact can be banned only if electricity generation by the PV modules is prevented, for example, by a darkening of the PV modules. However, this is difficult to be implemented for large PV systems or in case of fire.

Another problem with PV systems is the danger of an electric arc formation, due to the high DC voltage in conjunction with high DC currents flowing from the PV modules to the inverter. An electric arc may occur, for example, during maintenance (when disconnecting a current-carrying wire), in case of contact degradation at screwing connectors or plug-in connectors, at poorly soldered joints or bad screwing connectors or in case of a damaged cable insulation. Extinction of an arc that has occurred is usually only possible by a drastic reduction of the current flowing through the arc.

To prevent the occurrence of hazardous voltages in case of fire or maintenance during operation of a PV system, it is known to arrange switching devices, such as air gap switches or semiconductor switches, in close proximity to the PV modules, for example, in a junction box of the PV module, the switching devices switching the connection lines between the PV modules and the inverter into a de-energized state when being switched via central lines by the inverter or another control center. This can be done by an interruption of the connection lines by the switching devices or by shorting the PV modules, as for example disclosed in the Photon magazine, May 2005 issue, pp. 75-77. As disclosed in the document DE 10 2005 018 173 A1, the connection lines between the PV generator and the inverter can also be de-energized by a single switching device arranged at the PV generator.

For the transmission of control signals to the switching devices, additionally installed cables are used, which, however, in particular with large PV systems, is associated with increased installation costs. As an alternative, it is known from the publication DE 10 2006 060 815 A1 to apply the control signals as signals at a high frequency by means of a transformer to the DC cables for power transmission and to transfer these signals via these cables. For this purpose, the switching devices are provided with a control unit that decodes the control signals transmitted at a high frequency, and that controls the switching operation. This solution is also expensive, since for the application of the control signals a material-intensive transformer is required, owing to the high currents on the DC lines.

SUMMARY

In one embodiment a protective device is disclosed for a PV system that prevents, reliably and securely with a simple structure, the DC lines leading from a PV generator to an inverter from being supplied with high voltages in case of danger. In another embodiment a method for operating such a protective device is disclosed, and in a further embodiment a PV module with such a protective device is disclosed.

According to one embodiment, the protective device comprises a detection device for a signal applied via the at least one output, and is configured to provide a low level-limited voltage at the output in case an applied signal does not meet predetermined criteria. The protective device is also configured such that the output is connected with low resistance to the at least one input via a switching device in case the applied signal meets the predetermined criteria. According to the present disclosure, the word criteria is intended to be interpreted broadly in either its singular or plural form.

The protective device, which in one embodiment is arranged spatially as close to the PV generator as possible, and which is connected at its input to the PV generator, and at its output connected to an inverter, which eventually is remotely located, exposes the output initially only to the non-hazardous low voltage. In this way, information is transmitted from the protective device that the PV generator is exposed to solar irradiation. Only when an inverter (or another device remote from the generator) responds to this and transmits a predetermined signal, the protective device connects the output to its input with low resistance via the switching device and exposes the DC connection line to the inverter to the full voltage of the PV generator, or, in other words, the protective device connects the PV generator to the DC lines, whereby the full power of the PV generator can then be transferred to the inverter. When switching off the inverter, e.g., in case of danger, the predetermined criterion is no longer met, for example, because the predetermined signal is no longer applied. Input and output of the protective device are separated then by the switching device and the output is again exposed to the non-hazardous low voltage only.

According to an advantageous embodiment of the protective device, the detection device comprises a current measuring device for a current emitted at the at least one output, wherein the applied signal is associated with a magnitude of the current. Alternatively, the detection device comprises a voltage measuring device for the voltage applied to the at least one output, wherein the applied signal is associated with a level of the voltage.

According to a further advantageous embodiment of the protective device, the predetermined criteria are related to a temporal modulation of the signal, for example, a pulse pattern. In this way, a reliable detection of a switching signal is achieved.

According to a further advantageous embodiment the predetermined criteria are related to the magnitude of the current emitted at the at least one output, wherein the protective device is configured to provide the low voltage at the at least one output, if the emitted current is less than a lower threshold. The protective device is further configured to connect the at least one output with low resistance to the at least one input via the switching device, if the emitted current is greater than or equal to an upper threshold, wherein the upper threshold is greater than or equal to the lower threshold.

This ensures that the protective device connects the PV generator to the DC lines if an inverter loads its DC input that is exposed to this low voltage, and a current flow at or above the upper threshold is detected at the output of the protective device. The other way round, when switching off the inverter, e.g., in case of danger, the DC input of the inverter and, thus, the output of the protective device is no longer loaded, and the input and output of the protective device are disconnected again by the switching device. The threshold values for the current are selected in one embodiment such that a connection of the output of the protective device to the input caused by touching the DC connection lines, by a significantly reduced isolation resistance or by the conductivity of (fire) water is precluded.

According to an advantageous embodiment of the protective device, the protective device comprises a further input to apply a partial voltage from the PV generator for direct supply or for the generation of the low voltage. In this way, the low voltage can be provided economically without or with only minimal conversion losses.

According to a further advantageous embodiment of the protective device, the low voltage is applied to the at least one output at high impedance via a series resistor. This way it is achieved, among other things, that in case of several protective devices that are connected in parallel at their outputs, a current flow results at each of the protective devices when the low voltage signal is loaded and so each of the protective devices can perform its switching function.

According to a further advantageous embodiment of the protective device, the protective device comprises an arc detection component for detection of an electric arc that is connected to the switching device for the control thereof. In one embodiment the arc detection component is connected to the switching device in such a way that the switching device opens when an electric arc is detected. In this way, the protective device can be used to automatically extinguish electric arcs. The integration of the protection against hazardous voltage and arc extinction in the protective device allows an economic use of components, e.g., such elements as the switching device, which is used in both cases.

According to another embodiment, a photovoltaic module is disclosed that comprises such an integrated protective device. According PV modules can be used in the same way as known PV modules in PV systems and offers the benefits described before in context with the protective device without any further provisions.

In an advantageous embodiment of the PV module, the protective device is arranged in a junction box of the PV module, which allows a particularly compact design.

According to another embodiment of the disclosure, an operating method for a protective device of a PV system is disclosed, in which the protective device comprises at least one input for connection to a PV generator and at least one output intended for delivery of electrical power supplied by the PV generator. The operating method comprises supplying the at least one output with a low voltage and monitoring the at least one output for the presence of a signal, wherein a present signal, if applicable, is detected. The method further comprises supplying the at least one output with an operating voltage for delivering the total PV electric power provided by the PV generator, if a detected signal meets predetermined criteria. If no signal is present or if the detected signal does not meet predetermined criteria, the output is again supplied with the low voltage. The advantages correspond to those of the earlier described embodiments.

BRIEF DESCRIPTION OF THE DRAWINGS

In the following, the disclosure will be explained in more detail using embodiments and with reference to seven figures.

DETAILED DESCRIPTION

Figure 1:
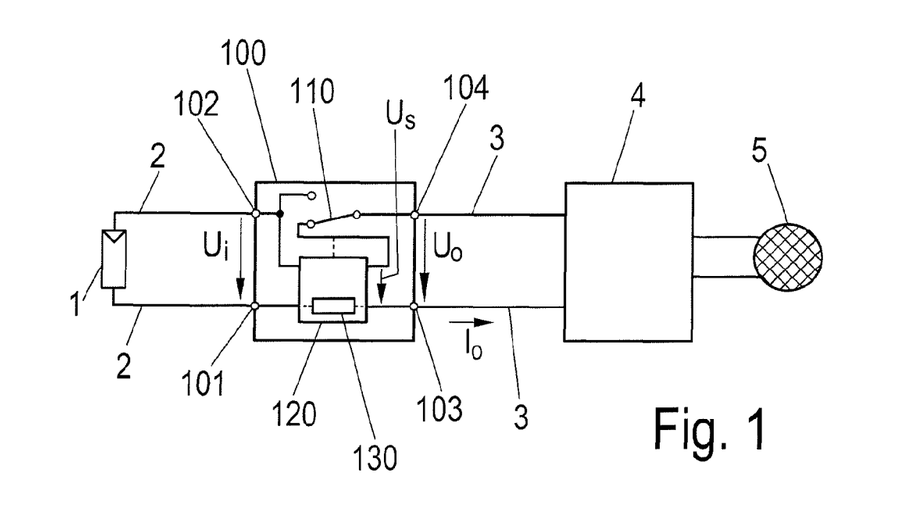
FIG. 1 shows a schematic diagram of a PV system with a protective device according to a first embodiment.

FIG. 1 schematically shows the basic structure of a PV system with a protective device according to a first embodiment.

The PV system comprises a PV generator 1 that is connected to inputs 101 and 102 of a protective device 100 via connection lines 2. The protective device 100 also has outputs 103 and 104, from which the DC lines 3 lead to an inverter 4 that is connected to a power supply network 5.

In one example, the PV generator 1 is symbolized in FIG. 1 by the electronic symbol of a single photovoltaic cell. In a practical implementation of the illustrated PV system the PV generator 1 may be a single PV module, which in turn comprises a plurality of photovoltaic cells. Quite as well, the PV generator 1 may be a series connection of several PV modules, a so-called string, in which the voltages of the individual PV modules add up. Also, a parallel connection or a mixed series and parallel connection of PV modules is possible.

The power supplied by the PV generator 1 is applied to the protective device 100 as an input voltage $U_i$. In one example, the negative input 101 is applied with a negative potential and the input 102 on the other hand with a positive potential. The voltage supplied by the protective device 100 at the outputs 103 and 104 is hereinafter referred to as the output voltage Uo.

In the shown embodiment, the output 103 is permanently connected to the input 101 with low resistance via a current measuring device 130, whereas the output 104 can be connected to the input 102 via a switching device 110. The current measuring device 130 is part of a control unit 120 of the protective device 100, the control unit 120 being supplied by the voltage Ui at the inputs 101, 102. The control unit 120 controls on the one hand the switching device 110 dependent on a current Io measured by the current measuring device 130, in this embodiment at the output 103, and provides on the other hand a low voltage Us, also called protective voltage Us, which is applied to the outputs 103, 104, when the output 104 is not connected to the input 102. For this purpose, the switching device 110 is designed in this embodiment as a changeover switch.

As explained in more detail below, in case of danger the protective device prevents the occurrence of hazardously high voltages at its outputs 103, 104 and, thus, at the DC lines 3, which lead to the inverter. Since independently of this the PV generator 1 applies a voltage at a level that is eventually dangerous to life to the connection lines 2 in case of light irradiation, the protective device 100 is, in one embodiment, positioned as close as possible to the PV generator 1, to keep the length of the connection lines 2 correspondingly short.

Figure 2:
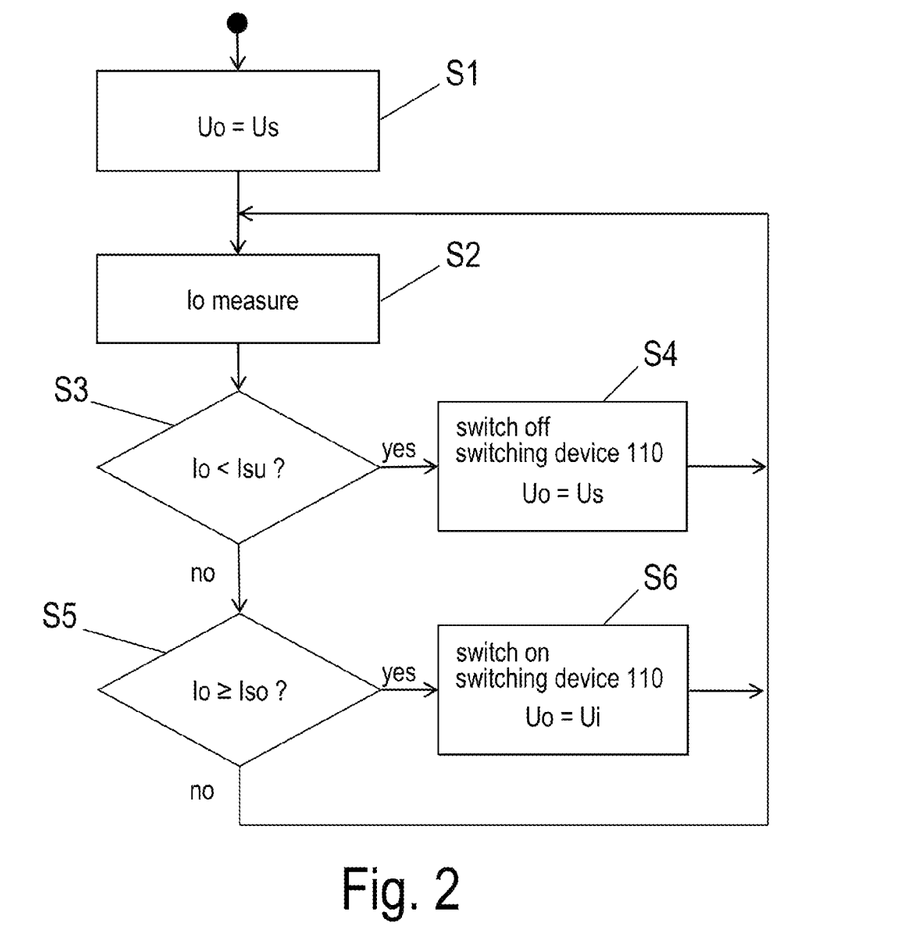
FIG. 2 shows a flow chart of an operating method for a protective device.

In the following, an operation method for a protective device is illustrated by a flow chart in FIG. 2, wherein by way of example and not limiting, reference is made to the protective device shown schematically in FIG. 1.

It is presumed to have a starting point of the method at which the PV generator 1 delivers no or only a negligibly low output voltage, e.g., at night. The output voltage of the PV generator 1 is supplied via the inputs 101 and 102 of the protective device 100 as the input voltage Ui. If this input voltage Ui now increases, due to increasing intensity of solar irradiation at the PV generator 1, the control unit 120 of the protective device 100 is also sufficiently supplied with a voltage for operation.

The control unit 120 then provides, at S1, a low voltage Us at the outputs 103 and 104 of the protective device 100, the level of which does not exceed a safe value for DC voltages, independently of the input voltage Ui. The low voltage Us may be, for example, a few volts up to a few tens of volts. It is desirable for the low voltage Us being in the range of the so-called protective voltages. Voltages in this range, which extend to about 120 V for DC voltages, are presumed to be non-hazardous to life in case of contact therewith. With reference to the example in FIG. 4 it has to be mentioned in advance that in case of a series connection of several protective devices 100 it has to be considered that the sum of the low voltages Us of the individual protective devices 100 has to be in the range of the protective voltages. The low voltage Us is supplied as the output voltage Uo to the DC lines 3 and to the inverter 4.

Provisions may be made for the level of the low voltage Us being independent of the input voltage Ui from a certain level on, and, thus, independent of the light intensity, the PV generator 1 is irradiated with. Alternatively, it is possible to have the level of the low voltage Us dependent on the level of the input voltage Ui, e.g., proportional to the input voltage, or proportional to the input voltage within a predetermined input voltage range. In this way, information about the radiation intensity is transmitted to the inverter 4 via the level of the low voltage Us, which the inverter can evaluate to control its own operating state.

At S2, the magnitude of the current Io at the output 103 or 104 of the protective device 100 is measured by the control unit 120 by means of the current measuring device 130.

At S3, this current Io is compared with a predetermined lower current threshold Isu. When the current Io is below the lower threshold value Isu (Yes at S3), the method branches to S4 where the switching device 110 is switched off or remains switched off. As a result, the low voltage Us is still provided at the outputs 103, 104 as the output voltage Uo. The method then returns to S2, wherein the current Io is measured again. If, in contrast, the current Io is greater than or equal to the lower threshold value Isu at S3 (No at S3), the method branches to S5.

At S5, the current Io is compared with a predetermined upper current threshold Iso. As usual for inverters, the inverter 4 is designed to load its DC input upon detection of a voltage being applied to the DC input, in order to extract electrical power from the PV generator, which can be fed into the power supply network 5 in the form of alternating current.

The loading of the DC input of the inverter 4 leads to a current Io at the outputs 103, 104 of the protective device 100 that reaches or exceeds the current threshold Iso. In this case (Yes at S5), the method branches from S5 to S6, where the control unit 120 switches on the switching device 110. The input 102 is then connected to the output 104 with low resistance via the switching device 110. Since in this embodiment the input 101 is permanently connected with low resistance to the output 103, for the output voltage Uo at the outputs 103, 104 essentially the input voltage Ui, i.e., the voltage provided by the PV generator 1, occurs as the operating voltage. Due to the low resistance connection between the inputs 101, 102 and the outputs 103, 104, mainly the entire electrical power provided by the PV generator 1 can be transferred via the DC lines 3 to the inverter 4, just as if this were the case for a direct connection of the PV generator 1 with the inverter 4 without the protective device 100. The increase of the current Io inducing the switching-on of the switching device 110 may have its cause also in a start-up of a power supply unit or a boost converter of the inverter 4. It is also possible that the inverter 4 actively conducts a loading of its DC input, which quasi serves as a control signal for the protective device 100. After switching on the switching device 110 at S6, the method returns to S2, in which again the current Io is measured.

The current Io is continuously or repeatedly measured (at S2) by the control unit 120 of the protective device 100. If, for example for maintenance or in case of danger, the inverter 4 is shut down or disconnected from the power supply network 5, it does not take electrical power at its DC side anymore. The current through the DC lines 3 goes back to zero and in particular gets less than the lower threshold Isu. This, in turn, is detected by the protective device 100 at S3, whereupon at S4, which is executed afterwards, the switching device 110 is switched off. The output voltage Uo is then in turn merely the non-hazardous low voltage Us.

The upper threshold Iso may be chosen to be equal to the lower threshold Isu. However, it is advantageous in one embodiment that the upper threshold value Iso is higher than the lower threshold Isu. Thus, a hysteresis is established that supports a defined switching between the two switching states of the switching device 110. In a case in which the current Io neither falls below the lower threshold value, nor is equal to or above the upper threshold value, a direct return to S2 is performed, where again the current Io is measured without a prior branching to one of the acts S4 or S6.

In this embodiment, therefore, the magnitude of the measured current Io represents a signal that is received by the protective device 100 and that is compared with predetermined criteria to determine the switching state of the switching device 110. The criteria relates in one embodiment to the magnitude of the current Io and is specified in the form of the threshold values Isu and Iso. Due to applying the low voltage Us to the DC power lines 3, the protective device 100 can detect a power demand by the inverter 4 by means of performing the current measurement, i.e., without any need for additional control lines or a modulation of the DC voltage by control signals. The long, and often exposed DC lines 3 thus carry the full DC voltage of the PV generator 1 only in a normal operating state, in which no potential hazard by high voltages on the DC lines 3 and high currents needs to be considered.

In case of danger it is the usual procedure of fire fighters to disconnect a scene of the fire from the power supply network before fire extinction. For a PV system, it is only achieved by the protective device that the usual procedure of disconnecting the inverters from the AC power supply network actually constitutes an adequate measure to at least disconnect the exposed DC-side components, such as the DC lines 3 and the inverter 4 itself, from the dangerously high DC voltage that is generated by the PV generator.

In an alternative embodiment of the protective device and the method, respectively, it is provided to switch on the switching device 110 only if a predetermined pattern of pulses for each of which the current Io is greater than or equal to the upper threshold value Iso is detected. Such an "encoded" switching-on can prevent unintentional switching, e.g., by currents that flow as a result of a defective insulation even in a hazardous situation. In a further embodiment, which will be explained in context with FIG. 4 in more detail below, it is provided to detect a comparable pattern on the basis of a voltage pulse signal, or based on changes of a voltage signal at the output of the protective device. Also, a detection of a current signal based on current changes without specifying absolute current threshold values is possible.

It is known to arrange DC-DC converters integrated in PV modules, e.g., in a junction box of the PV module, which act for example as boost converters during operation. Such a DC-DC converter can serve as a protective device within the spirit of the disclosure and can perform a method as described in context with FIG. 2. For this, the DC-DC converter is adapted to initially apply the low voltage Us at its output. Only if a signal is detected by the DC-DC converter that meets a predetermined criterion, for example, if a current is detected that lies above the upper threshold Iso, the DC-DC converter is operated in a normal operating condition for delivery of substantially all the power from the PV module (except for conversion losses). In this mode, an operating voltage is applied at the output of the DC-DC converter that is not limited in its value to the range of protective low voltages. Accordingly, it is switched from the operating voltage back to the low voltage Us, if the detected signal does not meet the predetermined criterion anymore, for example, if the current goes below the lower current threshold value Isu.

Figure 3:
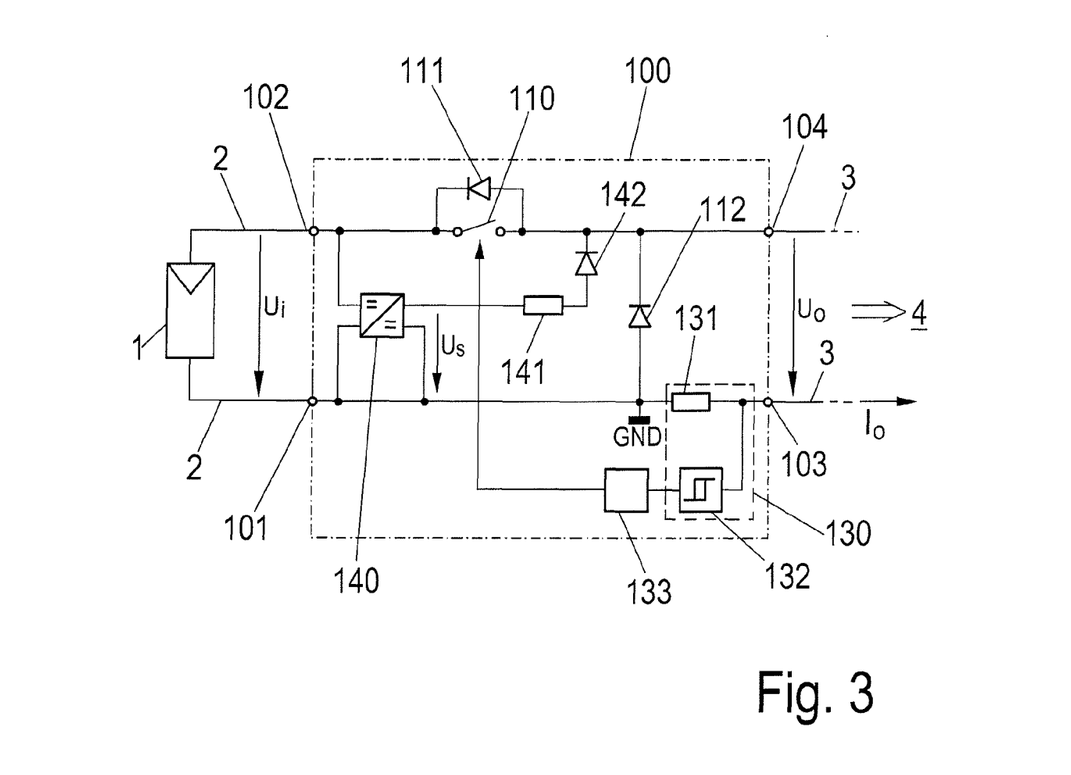
FIG. 3 shows a circuit diagram of a second embodiment of a protective device.

FIG. 3 shows the configuration of a protective device 100 according to a further embodiment, in a detailed schematic. Same reference numerals in this figure as well as in the following figures designate same as well as equivalent elements as in FIG. 1.

In one example, the protective device 100 is again connected with its inputs 101 and 102 to a PV generator 1, which is symbolized by a single photovoltaic cell, via two connection lines 2. As explained in context with FIG. 1, the PV generator 1 may comprise one or more PV modules, in particular connected in series. The same holds true for the embodiments described later.

In addition to the inputs 101 and 102, the protective device 100 comprises outputs 103 and 104. While the output 103 is permanently connected to the input 101 with low resistance via a current sensing resistor (shunt) 131, the output 104 can be selectively connected to the input 102 via the switching device 110. The switching device 110 is symbolically shown as a controllable switch, for example, the switching device 110 is realized by a semiconductor switch, e.g., in the form of an IGBT (Insulated Gate Bipolar Transistor) or a MOSFET (Metal Oxide Semiconductor Field Effect Transistor). The switching device 110 can switch the output 104, as illustrated. However, by means of the switching device 110 it is also possible to switch the output 103, or, in a multipolar construction of the switching device 110, to switch both outputs 103, 104. Also, for example, in order to increase the reliability of switching, it may be provided to use a plurality of switches, for example, semiconductor switches, in a series connection as the switching device 110.

In parallel to the switching path of the switching device 110, a diode 111 is placed. The diode 111 protects a switching device 110 that is realized by a semiconductor switch against too high blocking voltages, which may occur when the PV generator 1 is shaded while there is a voltage at the outputs 103, 104, e.g., due to a capacitor in the DC input circuit of the inverter. Depending on the kind of semiconductor switch 111 used, the diode may already be integrated in the semiconductor switch due to the internal structure of the semiconductor. In this case it is referred to also as an intrinsic diode.

A further diode 112 is connected across the outputs 103, 104. It serves as a bypass diode for an application, in which a plurality of PV generators 1 with respective protective devices 100 are connected in series. Such a system concept will be explained in more detail in context with FIG. 4.

The current sensing resistor 131 forms, together with a threshold switch 132, a current measuring device 130. At the input of the threshold switch 132, a voltage with respect to the reference potential GND as chosen for the protective device 100 arises that is proportional to the current Io. This voltage is compared by the threshold switch 132 with a voltage that corresponds to a predetermined current Is. A voltage occurs at the output of the threshold switch 132 if the current Io exceeds the predetermined threshold Is. For a reliable detection and for achieving defined switching states a hysteresis can be provided for the switching process. As already described in conjunction with FIG. 2, diverging lower and upper thresholds Isu, Iso are given then. The thresholds are selected such that a switching-on of the switching device 110 in case of touching one of the DC lines 3 or in case of a severely reduced isolation resistance of the DC lines 3 or of the DC input of the inverter 4, e.g., by water for firefighting, is excluded.

The threshold switch 132 is connected to a timer 133, the output of which has a non-zero voltage if the non-zero signal is present at its input for more than a predetermined time period tx. From the output of the timer 133, the switching device 110 is switched. The timer 133 precludes short interfering voltage pulses that are induced, for example, in the DC lines 3, from causing the switching of the switching device 110. Only if a current flow Io greater than Is is detected that lasts longer than the predetermined time period tx, e.g., longer than a few hundred milliseconds or a few seconds, the switching device 110 is switched on, wherein, if necessary, a further time delay is executed before switching. The further time delay ensures that in case of a plurality of protective devices 100 connected in parallel, a switching of a first protective device 100 does not interrupt the current flowing at the outputs 103, 104 of the further protective devices 100 before the end of the respective predetermined period of time tx.

For reasons of safety, there is advantageously no time delay provided in the opposite case that the current Io falls below the threshold Is. In this case, the switching device 110 immediately switches off after the threshold is underrun and only switches on again when the threshold is exceeded for longer than the predetermined period tx.

In the embodiment in FIG. 3, the low voltage Us is generated from the input voltage Ui by a DC-DC converter 140. The low voltage Us is connected with its negative pole to the reference potential GND and with its positive pole via a series resistor 141 and a diode 142 to the output 104. The diode 142 prevents a reverse current into the DC-DC converter 140 if the output 104 is applied to a voltage in excess of the low voltage Us, e.g., if the switching device 110 is switched on. The series resistor 141 is used to limit the current caused by low voltage Us. The series resistor 141 may of course not be chosen so large that a current flow larger than the threshold value Is is not achieved anymore for a given level of the low voltage Us. The series resistor 141 may operate in combination with a plurality of interconnected, in particular, in parallel connected, protective devices and in combination with an arc extinction, as described in conjunction with FIG. 6. Alternatively, or additionally to the series resistor 141, the DC-DC converter 140 may be designed to be actively controlled current-limiting.

As an alternative to the DC-DC converter 140, a voltage regulator designed as a series regulator (linear regulator) or as a shunt regulator may also be used to limit the input voltage Ui to the low voltage Us. Such regulators are simpler in design, however, such regulators are sometimes associated with higher conversion losses.

In a further embodiment, the diode 111 is not provided. The switching device 110 opens at currents Io less than or equal to the lower threshold Isu and, thus, also for negative currents (reverse currents). Without the diode 111 no reverse current flows through the PV generator 1 in case the switching device is open. This functionality is, in particular, reasonable for a parallel connection of a plurality of PV generators, because otherwise significant reverse currents may occur in one of the PV generators, e.g. due to an incorrect wiring or defective bypass diodes. If a protective device is used that prevents a reverse current, the fuse that usually is used for a parallel connection of PV generators, e.g., in case of a parallel connection of strings, can be omitted, if for each of the PV generators to be connected in parallel such a protective device exists. If semiconductor switches with intrinsic diodes are used for the switching device 110, two such semiconductor switches can be connected bi-directionally in series to form a switching device 110 for which a reverse current is prevented when the switching device 110 is open.

Figure 4:
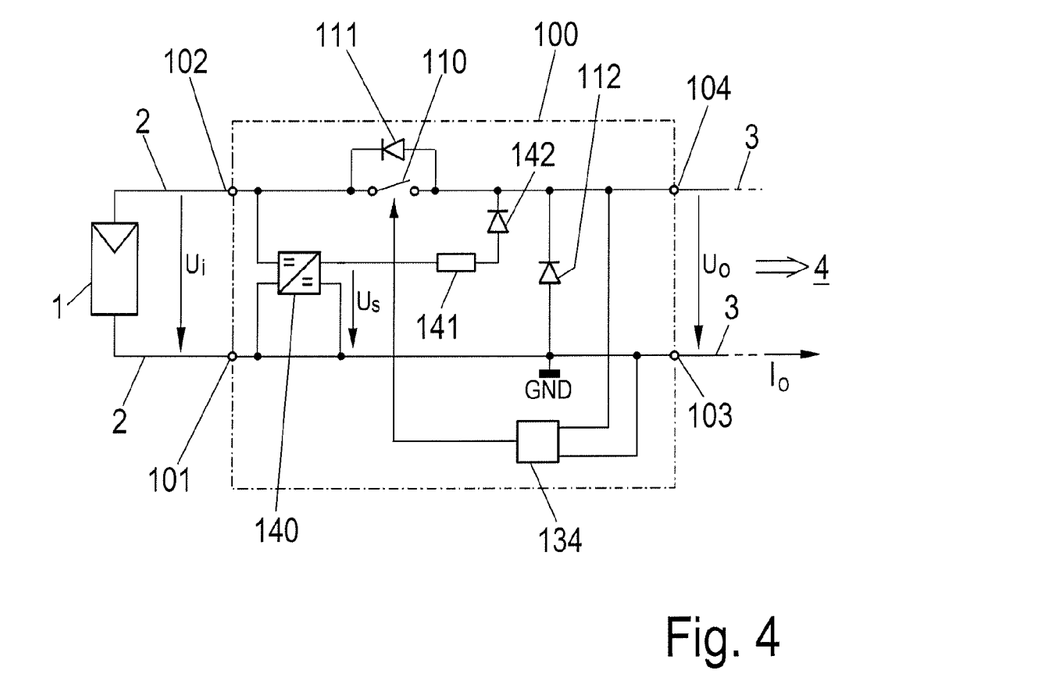
FIG. 4 shows a circuit diagram of a third embodiment of a protective device.

FIG. 4 shows a detailed schematic of the structure of a protective device 100 in a further embodiment. Like in the embodiment shown in FIG. 3 again a switching device 110 is provided, by means of which one of the inputs, in this case the input 102, can be connected with low resistance to one of the outputs, in this case the output 104. The other input 101 is permanently connected to the other output 103 in one embodiment. Further, like in the embodiment of FIG. 3, a DC-DC converter 140 is provided for generating a protective low voltage Us, the outputs 103, 104 are exposed to via a series resistor 141 and a diode 142, in case that the switching device 110 is open.

In contrast to the embodiments shown before, in this case the level of the current Io provided by the outputs does not represent the signal that is compared with predetermined criteria. Instead, the switching device 110 is switched on when a signal that is encoded in a certain way, for example, a pulse sequence, is detected, by which the DC voltage that is present at the outputs 103, 104 is modulated.

The protective device 100 comprises a decoding unit 134 for this purpose, wherein the voltage Uo between the outputs 103, 104 is applied to the decoding unit 134 for evaluation. The decoding unit 134 monitors whether a voltage signal is present at the outputs 103, 104 that varies with time according to predetermined criteria. A temporal variation, also called modulation, can be provided, for example, by a series of pulses (pulse pattern), wherein each pulse is characterized by a short voltage drop. If a predetermined pattern is detected, the decoding unit 134 switches on the switching device 110, if not, the switching device 110 is (or remains) switched off.

In an embodiment not shown here, the decoding unit 134 can be adapted alternatively to evaluate the current Io flowing at the outputs 103, 104 with respect to the presence of a modulated current signal. Similarly to the case of evaluating the output voltage Uo, a modulation of the current Io can be provided, for example, by a sequence of pulses, wherein each pulse is characterized by a short current increase.

For a PV system with a protective device 100 as described in this embodiment it is provided that an appropriate signal for switching on the switching device 110 is modulated on the DC lines 3 by a device that is remotely located from the protective device 100. In a regular situation, the signal with the predetermined pattern is modulated repetitively, e.g., periodically, onto the DC lines 3, which causes the DC lines to be exposed to the voltage provided from the PV generator. In a hazardous situation, the modulation with the signal with the predetermined pattern stops, whereupon the protective device 100 interrupts the low-impedance connection between the PV generator 1 and the DC lines 3 and exposes them to the safe low voltage Us. This embodiment is particularly fail-safe, since, for example, a current due to a short circuit or due to an electric arc will not be interpreted erroneously as a signal for switching on the switching device. In one embodiment, a complex pulse pattern may be selected for switching on, wherein a redundancy can be provided, such that an erroneous detection of a supposed signal for switching on is minimized or practically excluded.

The modulation can be done by controlling at least one switch that can be clocked and that is connected to the DC lines 3, by a signal generator. For example, the switch that can be clocked can be arranged in a series connection with a load resistor between the two DC lines 3, that means, in parallel to the input terminals of an inverter and, thus, in parallel to the terminals 103 and 104 of the protective device 100. A clocked switching of the switch results in a modulated current in accordance with the clocking of the switch, which results in a modulated voltage signal at the terminals 103 and 104 because of the non-zero internal resistance of the protective device 100. The internal resistance of the protective device 100 is dominated by the series resistor 141 when the switching device 110 is (still) open. While the low voltage Us is applied, a relatively low current through the switch that can be clocked is thus sufficient to generate a clearly modulated voltage signal. The switch that can be clocked can be specially built in the inverter 4 for this purpose. Such a switch would have the additional benefit that a capacitor in an input stage of the inverter can be discharged regardless of the operating state of the inverter via the series arrangement of the switch that can be clocked and the load resistor, which may be desirable for reasons of safety.

Alternatively or additionally, an existing switch in the inverter 4, for example, a switch of a DC-DC converter or of another input stage of the inverter 4, can be used for applying the current or voltage signal. In one embodiment, for example, a separate switch that can be clocked can be used if the inverter 4 is not yet in operation and the DC lines 3 are applied to the low voltage Us. When the switching device 110 is at first switched off, a signal that satisfies the predetermined criteria for switching on the switching device 110 is at first generated by the separate switch that can be clocked. After the voltage signal has been detected by the protective device 100 and accordingly the switching device has been 110 closed, applying the signal can be performed by the switches of the input stage, which typically have a higher current capability.

By the clocked loading of the DC lines 3, a signal, for example in the form of a pulse sequence, is modulated onto the DC lines 3 without the need for a material-intensive transformer for feeding of the modulated signal in the inverter or in another device remote from the generator. Basically, this is achieved by the fact that the protective device 100 provides the low voltage Us.

Figure 5:
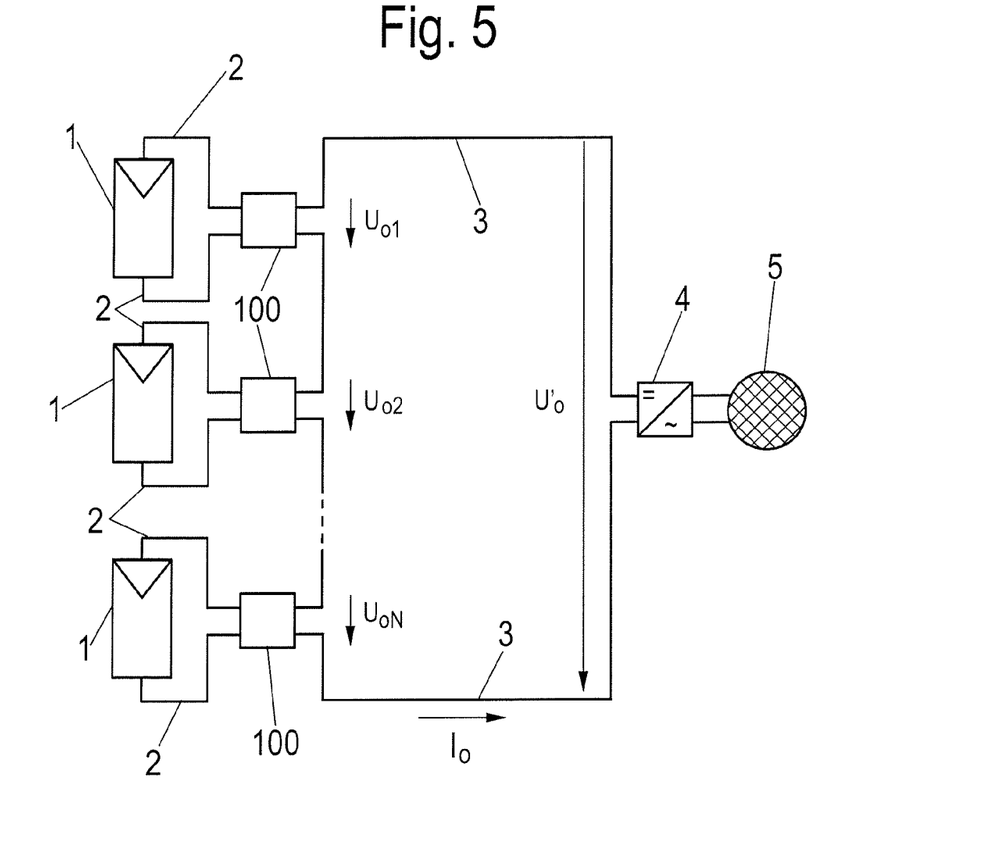
FIG. 5 shows a schematic diagram of a PV system with a plurality of protective devices.

FIG. 5 shows one embodiment of the disclosure, wherein a plurality of PV generators 1 are provided, each of which has a protective device 100 assigned thereto, and the respective PV generator 1 is connected therewith. In such a constellation with a plurality of PV generators 1, these are also referred to as partial PV generators 1. The protective devices 100 are connected in at their outputs, and the serial connection of the protective devices 100 is connected to the inverter 4.

For a number N of partial PV generators 1 with associated protective devices 100 that are connected this way, a total output voltage U'o that is applied to the DC lines 3 and to the input of the inverter 4 results as the sum of the voltages Uo at the outputs of the protective devices 100. The current Io detected by the individual protective devices 100 is the same for all protective devices and corresponds to the current Io flowing in the DC lines 3. If this current Io exceeds the threshold Is this is detected independently of each other by each of the protective devices 100, which then, after the predetermined period of time tx, switch on the switching devices 110. As a result, the electrical power provided by the respective PV generator 1 can be transferred to the inverter 4.

For the shown serial connection of the protective devices 100, it is reasonable to use a respective low voltage Us in the range of a few volts. Even for an interconnection of, for example, ten partial PV generators 1, the resulting voltage on the DC lines 3 in case of a hazardous situation is then in the range of some 10 V, which is still below the voltage limit of 120 V for DC voltage sources that is considered as dangerous. If, additionally, the maximum output voltage of each of the partial PV generators 1 is smaller than the voltage limit of 120 V that is considered as dangerous, in a hazardous situation there is at no point of the PV system any hazardous voltage, even not within a partial PV generator 1 or on the lines connecting it with the respective protective device 100.

In context with the configuration shown in FIG. 5, it is particularly advantageous to use a single PV module as a partial PV generator 1 and to arrange the respective protective device 100 integrated in this PV module, e.g., integrated in a junction box of the PV module. Typically, for a PV module the maximum voltage is below the voltage limit of 120 V. In this way, a PV module is established that can be, just like a known PV module that has no protective device, connected to an inverter 4 within a PV system, for example connected in series to form a string, wherein in case of a hazardous situation at no point of the PV system there is a dangerous voltage.

The junction box can also be designed to be splash-proof in one embodiment. In this way it can be prevented that connecting cables in the PV module that lead to the protective device 100, and which are exposed directly to the eventually high output voltage of the PV module, can come into contact with water for firefighting. Thus, even with PV modules that have a maximum output voltage above the specified voltage limit of 120 V, a high level of security in case of a hazard can be reached.

As an alternative to or in combination with the series connection, a parallel connection of PV generators 1 with respective dedicated protective devices 100 is possible. In such a case, it has to be considered that the current flowing through the inverter and the DC lines 3 splits for the individual protective devices 100, such that for initiating the switching of the individual switching devices 110 in total a higher current flow from the inverter 4 has to be required. Since the low voltages Us of the different protective devices 100 will not be exactly equal, due to component tolerances of the DC-DC converters 140, a strongly non-uniform current distribution among the protective devices 100 could arise in case of the parallel connection of the protective devices 100. This is prevented by the series resistor 141, via which the output of the DC-DC converter 140 is connected to the output 104 of the protective device 100.

Figure 6:
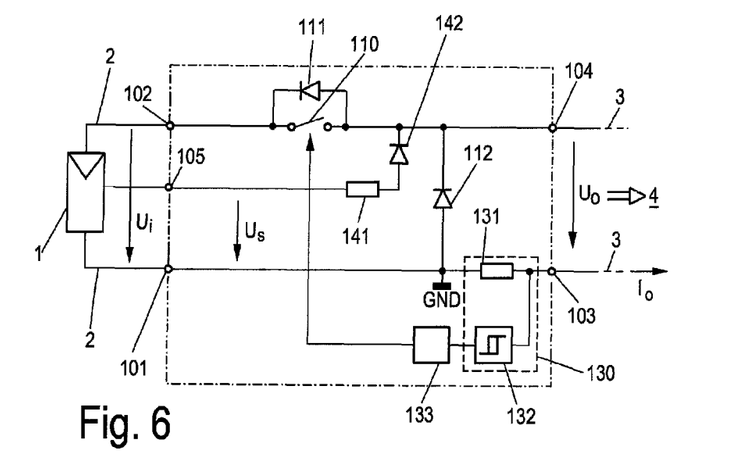
FIG. 6 shows a circuit diagram of a fourth embodiment of a protective device.

FIG. 6 shows the circuit diagram of a further embodiment of the protective device 100 in an illustration similar to FIG. 3. In contrast to the embodiment of FIG. 3, a further input 105 is provided here that is connected to a voltage tap at the PV generator 1. The voltage tap at the PV generator 1 taps a partial voltage of the actual output voltage.

If the PV generator 1 is, for example, an arrangement of a plurality of series-connected PV modules, the tap can be made between two of the PV modules. If, for example, ten serially connected PV modules form the PV generator 1, the tap can be made between the first and second PV module, such that, in case of a uniform irradiation on all PV modules of the PV generator 1, the voltage at the tap is a tenth of the total power provided by the PV generator 1.

The tapped voltage is applied to the input 105 as the low voltage Us of the protective device 100, from where it is again applied to the output 104 of the protective device 100 via the series resistor 141 and the diode 142. With the shown circuitry, the protective device 100 can provide the low voltage Us without additional effort for components and without losses associated with a DC-DC converter or a voltage regulator, or with less of these losses, respectively.

The supply of the low voltage Us via a voltage tap may also be performed in an alternative embodiment, if a plurality of partial PV generators 1, each with its own dedicated protective device 100, are connected in series, as shown in FIG. 5. This is particularly appropriate if single PV modules are used as partial PV generators 1 and the protective device 100 is located in a junction box of the PV module. The PV cells of PV modules are commonly combined to several groups, e.g., three groups, wherein the PV cells of a group are serially connected within the cell array. The connection lines of the individual groups are brought separately into the junction box, where they are then connected together in series, wherein usually there is a bypass diode provided anti-parallel to each group. Thus, taps of the PV module that provide the partial voltages are already available in the junction box. One of these taps can be connected to the further input 105 to derive the low voltage Us from this partial voltage in a simple way.

Figure 7:
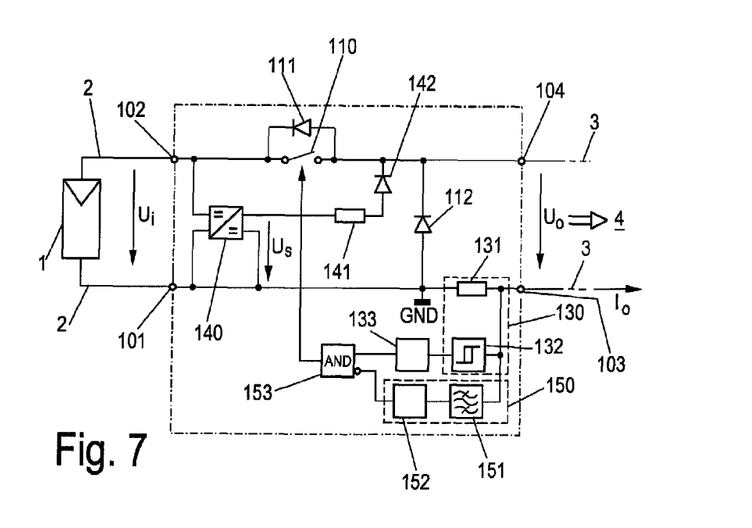
FIG. 7 shows a circuit diagram of a fifth embodiment of a protective device.

FIG. 7 shows a further embodiment of the protective device 100 in a circuit diagram similar to FIG. 3. In contrast to the previous embodiments, the protective device shown here does not only serve for the shutdown of a dangerous high DC voltage on the DC lines, but also for the extinction of an electric arc in the current flow between the PV generator 1 and the inverter 4. For this purpose, means for electric arc detection 150 are provided that comprise, for example, a band-pass filter 151 and downstream of that an envelope detector (envelope decoder) 152. Other methods of electric arc detection may also be used.

During the burning of an electric arc between two adjacent contact points a highly ionized burning plasma is formed, via which the current flow occurs. The current flowing via an electric arc is usually not constant, but fluctuates with intense higher frequency components. If an arc evolves at any point in the current flow between the PV generator 1 and the inverter 4, the DC lines 3 are loaded with a distinct higher frequency interference spectrum. The presence of the higher frequency interference in a frequency range that is characteristic for an electric arc is detected by the band-pass filter 151 and the envelope detector 152 downstream of it. At the output of the envelope detector 152 a non-zero voltage signal occurs if an arc is detected.

The output of the envelope detector 152 and the output of the timer 133 are combined by a logical AND device 153, wherein the input connected to the envelope detector 152 is designed to be inverted. The output of the AND device 153 controls the switching device 110. As a result of this logical operation, the switching device 110 is switched on if, on the one hand, a current Io above an upper threshold value Iso is present for longer than the predetermined time period tx, and, on the other hand, no electric arc is detected. The other way round, the switching device 110 disconnects the output 104 from the input 102, if a current Io lower than a lower threshold Isu is observed, or if an electric arc is detected in the DC circuit. After the disconnection of the output 104 from the input 102, again only the low voltage Us is provided at the outputs 103, 104. Due to the series resistor 141, the protective device 100 in this case does not provide sufficient current for maintaining the electric arc so that the arc is extinguished. In embodiments in which there is no series resistor 141, the same is achieved by the current limiting of the DC-DC converter 140, which is provided then.

Merely by way of example, the embodiments shown in FIGS. 5-7 are based on the embodiment presented in context with FIG. 3, in which the level of the current at the output of the protective device is used as a criterion as to whether the output is supplied with the low voltage or with the operating voltage of the PV generator. In these embodiments, the criterion of an encoded signal on the DC lines, on which the embodiment in FIG. 4 is based, can be used as well.

The invention claimed is:

1. A protective device for a photovoltaic system, comprising:
   at least one input configured to connect to a photovoltaic generator;
   at least one output configured to deliver electric power supplied by the photovoltaic generator;
   a detection device configured to receive a signal applied at the at least one output, wherein the protective device is configured to provide a low level-limited voltage at the at least one output when the applied signal does not meet a predetermined criteria, and wherein the protective device is further configured to connect the at least one output to the at least one input via a switching device when the applied signal meets the predetermined criteria;
   a DC-DC converter, a series regulator, a shunt regulator, or a further input configured to receive a partial voltage from the photovoltaic generator to generate the low level-limited voltage; and
   a timer configured to delay control of the switching device such that a switching of the switching device takes place only if the applied signal meets the predetermined criteria for more than a predetermined period of time.

2. The protective device according to claim 1, wherein the detection device comprises a current measuring device configured to measure a current at the at least one output, wherein the applied signal is associated with a magnitude of the current.

3. The protective device according to claim 2, wherein the predetermined criteria is related to a magnitude of the current, wherein the protective device is configured to provide the low level-limited voltage at the at least one output if the current is less than a lower threshold, and further configured to connect the at least one output to the at least one input via the switching device if the current is greater than or equal to an upper threshold, wherein the upper threshold is greater than or equal to the lower threshold.

4. The protective device according to claim 2, wherein the current measuring device comprises a shunt for current measurement and a threshold switch.

5. The protective device according to claim 1, wherein the detection device comprises a voltage measuring device configured to measure a voltage at the at least one output, wherein the applied signal is associated with a level of the voltage.

6. The protective device according to claim 1, wherein the predetermined criteria corresponds to a temporal modulation of the signal.

7. The protective device according to claim 1, wherein the low level-limited voltage is connected to the at least one output exhibiting a high impedance via a series resistor.

8. The protective device according to claim 1, wherein the low level-limited voltage is connected to the at least one output via a diode.

9. The protective device according to claim 1, wherein the switching device comprises a semiconductor switch.

10. The protective device according to claim 1, further comprising an arc detection component configured to detect an electric arc connected to the switching device for control thereof.

11. The protective device according to claim 10, wherein the arc detection component is connected to the switching device such that the switching device opens if an electric arc is detected.

12. The protective device according to claim 10, wherein the arc detection component comprises a band-pass filter and an envelope detector.

13. A protective device for a photovoltaic system, comprising:
    at least one input configured to connect to a photovoltaic generator;
    at least one output configured to deliver electric power supplied by the photovoltaic generator;
    a detection device configured to receive a signal applied at the at least one output, wherein the protective device is configured to provide a low level-limited voltage at the at least one output when the applied signal does not meet a predetermined criteria, and wherein the protective device is further configured to connect the at least one output to the at least one input via a switching device when the applied signal meets the predetermined criteria; and
    a DC-DC converter, a series regulator, a shunt regulator, or a further input configured to receive a partial voltage from the photovoltaic generator to generate the low level-limited voltage,
    wherein the detection device comprises a current measuring device configured to measure a current at the at least one output, wherein the applied signal is associated with a magnitude of the current,
    wherein the current measuring device comprises a shunt for current measurement and a threshold switch, and
    wherein the threshold switch exhibits a switching hysteresis.

14. The protective device according to claim 13, wherein the low level-limited voltage is connected to the at least one output exhibiting a high impedance via a series resistor.

15. The protective device according to claim 13, wherein the low level-limited voltage is connected to the at least one output via a diode.

16. The protective device according to claim 13, wherein the switching device comprises a semiconductor switch.

17. The protective device according to claim 13, further comprising an arc detection component configured to detect an electric arc connected to the switching device for control thereof.

18. The protective device according to claim 17, wherein the arc detection component is connected to the switching device such that the switching device opens if an electric arc is detected.

19. The protective device according to claim 17, wherein the arc detection component comprises a band-pass filter and an envelope detector.

20. An operating method for a protective device of a photovoltaic system that comprises at least one input configured to connect to a photovoltaic generator and at least one output configured to deliver the electric power supplied by the photovoltaic generator, comprising:
    applying a low level-limited voltage to the at least one output;
    monitoring the at least one output for a presence of a signal and, if applicable, detecting a present signal;
    applying an operating voltage to the at least one output for delivery of a total electric power supplied by the photovoltaic generator, if a detected signal meets a predetermined criteria using a switching device,
    applying the low level-limited voltage to the at least one output if there is no signal present or if the detected signal does not meet the predetermined criteria using the switching device;
    generating the low level-limited voltage by a DC-DC converter, a series regulator, a shunt regulator, or receiving a partial voltage from the photovoltaic generator at a further input; and
    using a timer to delay control of the switching device such that a switching of the switching device takes place only if the detected signal meets the predetermined criteria for more than a predetermined period of time.

21. The operating method according to claim 20, wherein the predetermined criteria is related to an operating state of an inverter of the photovoltaic system that is transmitted by means of a temporal modulation of the signal.

22. The operating method according to claim 20, wherein the predetermined criteria is related to a magnitude of a current at the at least one output, and wherein the at least one output is supplied with the operating voltage, if the current is greater than or equal to an upper threshold and with the low level-limited voltage if the output current is less than a lower threshold, wherein the lower threshold is less than or equal to the upper threshold.

23. The operating method according to claim 20, further comprising:
    monitoring whether another signal is present at the at least one output that is characteristic of presence of an electric arc, and
    applying the low level-limited voltage to the at least one output in the presence of such another signal.

* * * * *